Dec. 24, 1968 A. G. BOSE 3,418,495

SWITCHING

Filed Oct. 23, 1965

INVENTOR.
AMAR G. BOSE
BY Wolf, Greenfield + Hieken
ATTORNEYS

United States Patent Office 3,418,495

Patented Dec. 24, 1968

3,418,495

SWITCHING

Amar G. Bose, Chestnut Hill, Mass., assignor to Bose Corporation, Natick, Mass., a corporation of Massachusetts Filed Oct. 23, 1965, Ser. No. 503,965
7 Claims. (Cl. 307—239)

ABSTRACT OF THE DISCLOSURE

In a two-state modulation system in which a switched terminal is coupled to a load by an inductor and the load is shunted by a capacitor, a capacitor is connected between the switched terminal and ground. Alternately conducting PNP and NPN transistors are also connected to the switched terminal to perform the switching function. The last-mentioned capacitor is of value sufficiently large to prevent the voltage across a transistor from being significant until the current through that transistor is small and sufficiently small so that the potential on the switched terminal can rapidly assume the potential coupled to that terminal by the transistor switched from the nonconductive to the conductive state immediately after the other transistor was switched from the conducting to the nonconducting state so that the operating path followed by the transistors when switching from the conducting to the nonconducting state is along a path close to the *i–v* axes of the graphical representation of the transistor operating characteristics.

Figure 1:
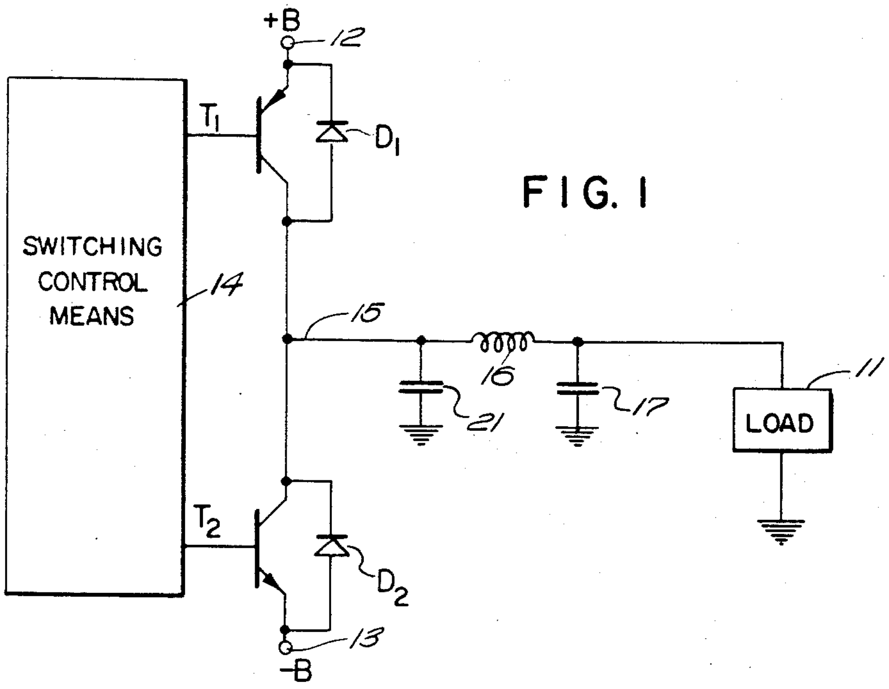

The present invention relates in general to efficient semiconductor switching circuits and more particularly concerns a semiconductor switching circuit for delivering high average current to an inductive means coupled to an output terminal while minimizing the power dissipation in the semiconductor switching means that alternately connects first and second direct potential sources to the output terminal.

Semiconductor devices are especially advantageous for coupling relatively high power to an output load when operated in the switching mode because, when conducting heavily, semiconductor switching devices normally have a very low effective internal resistance. A particularly advantageous system employing semiconductor switching means is described in a paper entitled A Two-State Modulation System presented by Amar G. Bose at the 1963 Western Electronic Show and Convention in San Francisco, California. The semiconductor switching means connects direct potential sources to an output terminal with inductive means connected to the output terminal. While such circuitry performs well, the property of the inductive means connected to the output terminal in opposing a sudden change in current tends to cause the semiconductor switching means to operate along a path in the voltage across-current through plane that is sufficiently far from the origin when the semiconductor switching means changes from the on to the off condition so that appreciable power may be dissipated in the semiconductor switching means and the device subjected to relatively high instantaneous power which the semiconductor switching means must be capable of handling. This required capability frequently dictates the use of a costly bulky high power high voltage device which loafs most of the time when useful power is delivered through the inductor to an external load.

Accordingly, it is an important object of this invention to provide circuitry employing semiconductor switching means capable of delivering high currents through an inducto while establishing an operating path for the semiconductor switching means in the voltage across-current through (*v–i*) plane that does not depart appreciably from the origin.

It is another object of the invention to achieve the preceding object with semiconductor devices operating in circuit characterized by an exceptionally high ratio of power delivered to the external load to the power consumed in the semiconductor switching devices.

It is a further object of the invention to achieve the preceding objects with circuitry employing semiconductor devices which need not be capable of handling unusually heavy instanteous power.

It is still a further object of the invention to achieve the preceding objects with the addition of but a single component, a component that is relatively inexpensive and requires no adjustment.

According to the invention, the operating path, which in the presence of only an inductor connected to the switched output terminal, would follow a path including a point where relatively high voltage appears across the semiconductor switching means at the same time the current through the semiconductor switching means is relatively high, is moved very close to the origin of the *v–i* plane by connecting a capacitor to the switched output terminal where the inductor means is connected. Circuit means external to a specific semiconductor device is provided for establishing the voltage across the device to essentially zero before the device is rendered conductive to draw current and thereby establish a desirable turn-on locus closely following the *v–i* axis. The capacitor connected to the output terminal markedly improves the turn-off locus while having virtually no effect on the already satisfactory turn-on locus.

Figure 2:
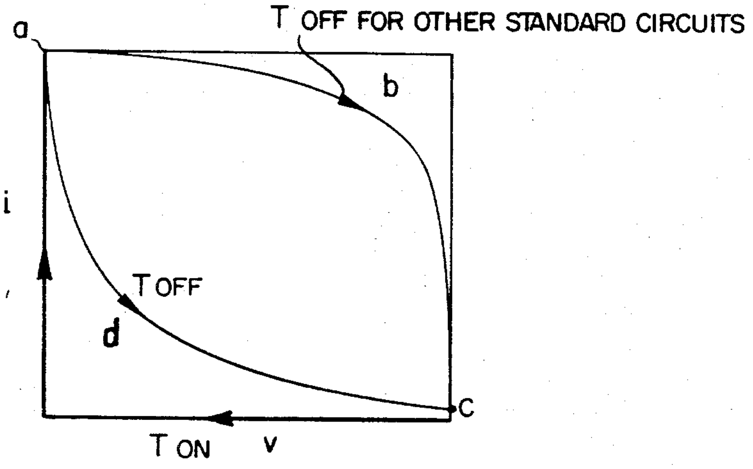

Numerous other features, objects and advantages of the invention will become apparent from the following specification when read in connection with the accompanying drawing in which:

FIG. 1 is a combined block-schematic circuit diagram of an exemplary embodiment of the invention; and FIG. 2 illustrates a typical turn-off operating path locus with prior art circuitry showing the excursions to a high voltage across-high current through operating point as compared to the close-to-the-origin turn-off operating path locus characterizing the circuitry according to the invention.

With reference now to the drawing and more particularly FIG. 1 thereof, there is shown a combined block-schematic circuit diagram of an exemplary embodiment according to the invention in which a load 11 receives power alternately from a source of positive direct potential applied to terminal 12 when transistor T1 is conducting and transistor T2 nonconducting and from a source of negative direct potential applied to terminal 13 when transistor T2 is conducting and transistor T1 nonconducting in response to appropriate signals provided by switching control means 14.

Switched output terminal 15 receives essentially the potential on terminal 12 when transistor T1 is conducting and essentially the potential on terminal 13 when transistor T2 is conducting so that the output waveform on switched output terminal 15 is essentially a two-state rectangular signal waveform fluctuating between the positive potential on terminal 12 and the negative potential on terminal 13 at a rate determined by switching control means 14, a rate that is preferably high compared to the resonant frequency corresponding to the inverse of the square root of the product of the inductor 16 inductance, connected between the switched output terminal 15 and load 11, and output capacitor 17 capacitance, connected across load 11. The added element which effects the improvement according to the invention is the capacitor 21 connected between switched output terminal 15 and the ground. A diode D1 is connected across transistor T1 and anothr diode D2 is connected across transistor T2.

Having described the physical arrangement of the circuitry, it is appropriate to explain the principles of operation. The improvement is better understood by initially considering that capacitor 21 is not in the circuit and initially assuming that transistor T1 is conducting and transistor T2 not conducting. The potential on output terminal 15 is then the positive potential on terminal 12. When switching control means 14 renders transistor T1 nonconductive and very shortly thereafter transistor T2 conductive, the current through inductor 16 resists the change in current direction by developing a voltage impulse tending to oppose the change in current of a sense that is negative with respect to ground to render diode D2 conductive and apply the relatively high potential between terminals 12 and 13 across transistor T1 while transistor T1 is still carrying substantial current so that the operating path embraces the segment *abc* (FIG. 2) as transistor T1 is in transition from the conducting to the nonconducting state. Similarly when transistor T2 switches from the conducting to the nonconducting state, inductor 16 responds to this change by developing a potential that is sufficiently negative to render diode D1 conductive until transistor T1 conducts. Transistor T2 then follows an operating path similar to the path *abc* in FIG. 2. Switching control means 14 establishes a switching rate that is preferably high compared to the inverse of the square root of the product of inductor 16 inductance and capacitor 17 capacitance and such that the inductor current direction results in the operation described above. The mode of operation just described is disadvantageous, not only from the standpoint of having the transistors dissipating more power, but also from the standpoint of requiring that the transistors T1 and T2 be capable of handling relatively high instantaneous peak powers with a consequent danger of secondary breakdown. These disadvantages are overcome by adding capacitor 21 so that the operating path followed by transistors T1 and T2 when switching from the conducting to the nonconducting state is over the path *adc*.

Capacitor 21 functions to keep the potential on output line 15 from changing too rapidly when one of transistors T1 and T2 switches from the conducting to the nonconducting state. Capacitor 21 may be thought of as a reservoir for current delivery to and from inductor 16 immediately following switching from the conducting to the nonconducting state. The result is that relatively low cost compact transistors may deliver exceptionally high output power levels to a load 11 while themselves dissipating negligible power and avoiding the contemperaneous occurrence of high instantaneous power.

In a specific exemplary embodiment of the invention incorporating essentially the circuit shown in FIG. 9 of French Patent No. 1,365,878 in which transistor T1 is a 2N1908 PNP and transistor T2 is a 2N1901 NPN, a value of 2,000 m.m.f. for capacitor 21 was found to be satisfactory. In general, capacitor 21 is chosen preferably to be sufficiently large to prevent the voltage across a transistor from being significant until the current through that transistor is small and sufficiently small so that the potential on line 15 can rapidly assume the potential coupled to line 15 of the transistor switched from the nonconductive to the conductive state immediately after the other transistor was switched from the conducting to the nonconducting state.

The principles of the invention are applicable to other switching devices; such as a pair of PNP transistors, a pair of NPN transistors, a transistor and a unilaterally conducting device, a pair of four layer devices and numerous other switching devices.

It is apparent that those skilled in the art may make numerous other modifications and uses of and departures from the specific embodiment described herein without departing from the inventive concepts. Consequently, the invention is to be construed as limited solely by the spirit and scope of the appended claims.

What is claimed is:

1. Switching circuitry comprising,
   a first source of a direct potential of first polarity with respect to the potential on a common terminal,
   said common terminal,
   an output terminal,
   first semiconductor switching means coupling said output terminal to said first source,
   inductive means connected to said output terminal for withdrawing current from said first source when said first semiconductor switching means is rendered conductive,
   switching control means for rendering said first semiconductor switching means alternately conductive and nonconductive,
   circuit means external to said first semiconductor switching means for establishing the voltage across said first semiconductor switching means essentially zero before said first semiconductor switching means is rendered conductive,
   and first capacitive means connected between said output terminal and said common terminal coacting with said circuit means for establishing an operating path locus for said first semiconductor switching means closely adjacent to the axes in the current-voltage plane over a cycle in which said first semiconductor switching means is rendered conductive and nonconductive to reduce peak instantaneous power dissipation in said first semiconductor switching means,
   the value of said first capacitive means being sufficiently large so as to prevent the voltage across each of said semiconductor switching means from being significant until the current through each semiconductor switching means is small and sufficiently small so that the potential on said output terminal can rapidly asume the potential coupled to said output terminal by that one of said semiconductor switching means switched from the nonconductive to the conductive state immediately after any other semiconductor switching means was switched from the conductive to the nonconducting state.

2. Switching circuitry in accordance with claim 1 and further comprising,
   second capacitive means connected in series between said common terminal and said inductive means,
   said switching control means including means for establishing the switching rate at which said first semiconductor switching means is rendered alternately conductive and nonconductive high compared to the reciprocal of the square root of the product of the inductance of said inductive means and the capacitance of said second capacitive means.

3. Switching circuitry in accordance with claim 2 and further comprising load means connected across said capacitive means dissipating much more power than is dissipated by said first semiconductor switching means.

4. Switching circuitry in accordance with claim 1 wherein said circuit means comprises,
   a second source of a direct potential of second polarity with respect to the potential on said common terminal different from said first polarity,
   second semiconductor switching means coupling said output terminal to said second source,
   said switching control means including means for rendering said second semiconductor switching means conductive in the intervals in which said first semiconductor switching means is conductive,
   said first capacitive means, said first semiconductor switching means and said first source comprising means for establishing an operating path locus for said second semiconductor switching means closely adjacent to the axes in the current-voltage plane over a cycle in which said second semiconductor switching means is rendered conductive and nonconductive to reduce peak instantaneous power dissipation in said second semiconductor switching means.

5. Switching circuitry in accordance with claim 4 and further comprising, second capacitive means connected in series between said common terminal and said inductive means, said switching control means including means for establishing the switching rate at which said first semiconductor switching means is rendered alternately conductive and nonconductive high compared to the reciprocal of the square root of the product of the inductance of said inductive means and the capacitance of siad second capacitive means.

6. Switching circuitry in accordance with claim 5 and further comprising load means connected across said capacitive means dissipating much more power than is dissipated by said first semiconductor switching means.

7. Switching circuitry in accordance with claim 4 wherein said first and second semiconductor switching means each comprise a transistor shunted by a unilaterally conducting device poled so that the unilaterally conducting device is normally nonconductive except during a short time interval immediately after the transistor shunted thereby is switched from the conductive state to the nonconductive state.

References Cited

UNITED STATES PATENTS

| | | | |
|---|---|---|---|
| 2,918,627 | 12/1959 | Dentz | 307—88.5 |
| 3,160,766 | 12/1964 | Reymond | 307—88.5 |
| 3,241,086 | 3/1966 | Orstein et al. | 307—88.5 |

FOREIGN PATENTS

| | | |
|---|---|---|
| 1,365,878 | 12/1964 | France. |

JOHN S. HEYMAN, *Primary Examiner.*

B. P. DAVIS, *Assistant Examiner.*

U.S. Cl. X.R.

307—246, 254